United States Patent
Kim

(10) Patent No.: US 7,432,157 B2
(45) Date of Patent: Oct. 7, 2008

(54) METHOD OF FABRICATING FLASH MEMORY

(75) Inventor: Bong Kil Kim, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 267 days.

(21) Appl. No.: 10/950,218

(22) Filed: Sep. 24, 2004

(65) Prior Publication Data

US 2005/0064666 A1   Mar. 24, 2005

(30) Foreign Application Priority Data

Sep. 24, 2003  (KR) .................. 10-2003-0066153

(51) Int. Cl.
*H01L 21/8247* (2006.01)
(52) U.S. Cl. .............. 438/264; 438/260; 257/321; 257/E21.681; 365/184
(58) Field of Classification Search .......... 438/260, 438/264; 257/321, 316; 365/184
See application file for complete search history.

(56) References Cited

U.S. PATENT DOCUMENTS

| | | | |
|---|---|---|---|
| 5,451,537 A * | 9/1995 | Tseng et al. | 438/253 |
| 6,153,472 A * | 11/2000 | Ding et al. | 438/264 |
| 6,171,909 B1 * | 1/2001 | Ding et al. | 438/267 |
| 6,391,722 B1 * | 5/2002 | Koh | 438/264 |
| 6,468,862 B1 * | 10/2002 | Tseng | 438/259 |
| 6,482,728 B2 | 11/2002 | Shin et al. | |
| 6,570,213 B1 * | 5/2003 | Wu | 257/315 |
| 2003/0096477 A1 * | 5/2003 | Bez et al. | 438/257 |

FOREIGN PATENT DOCUMENTS

| KR | 10-2002-0067787 A | 8/2002 |
|---|---|---|
| KR | 10-2003-0029203 A | 4/2003 |

* cited by examiner

Primary Examiner—Bradley W. Baumeister
Assistant Examiner—Steven J Fulk
(74) Attorney, Agent, or Firm—Saliwanchik, Lloyd & Saliwanchik

(57) ABSTRACT

Flash memory and methods of fabricating flash memory are disclosed. A disclosed method comprises: forming a first floating gate; and extending the first floating gate by forming a second floating gate adjacent a first sidewall of the floating gate. The second floating gate extends upward above the first floating gate. The method also includes depositing a dielectric layer on the first floating gate and the second floating gate; and forming a control gate on the dielectric layer.

4 Claims, 8 Drawing Sheets

METHOD OF FABRICATING FLASH MEMORY

FIELD OF THE DISCLOSURE

The present disclosure relates to flash memory and, more particularly, to flash memory and methods for fabricating flash memory.

BACKGROUND

A flash memory generally comprises a floating gate and a control gate. A dielectric layer such as an oxide-nitride-oxide (hereinafter referred to as "ONO") layer is positioned between the floating gate and the control gate. A tunneling oxide layer is positioned between the floating gate and a silicon substrate. Flash memory usually stores or removes data by placing or removing electrons or holes in or from the floating gate. Because the floating gate is completely isolated by the tunneling oxide layer and the dielectric layer, once electrons or holes enter the floating gate, they cannot escape from the floating gate even though no power is supplied. Therefore, data can be stored in the flash memory for long time periods without using power.

In order to write or erase data into or from the flash memory, a bias voltage is applied to terminals accessible from outside the memory. That is, a sufficiently strong voltage must be applied to the control gate and to a junction or substrate to generate a strong electric field at both ends of the tunneling oxide. The coupling ratio (hereinafter referred to as "CR") is a ratio of the voltage applied to the control gate and the junction or substrate, and the voltage induced in the floating gate. As the coupling ratio CR increases, the efficiency of programming and erase operations of a memory cell improves such that the voltage which must be applied from outside to effect such operations decreases.

The CR is defined by the ratio between the capacitance of the tunneling oxide layer and the capacitance of the ONO layer. When the tunneling oxide capacitance is represented as $C_{TUN}$ and the ONO capacitance is represented as $C_{ONO}$, the coupling ratio CR may be expressed as follows:

$$CR = \frac{C_{ONO}}{(C_{TUN} + C_{ONO})}$$

For a high CR, the $C_{ONO}$ must be relatively high compared to the $C_{TUN}$. Capacitance is determined by several factors such as the dielectric constant, the thickness of a dielectric layer, and the area of a capacitor.

In a known flash memory, the thickness of the tunneling oxide layer is about 80 Å to 120 Å, and the thickness of the dielectric layer is about 150 Å to 300 Å. As a result, for corresponding areas of the tunneling oxide layer and dielectric layer, the $C_{ONO}$ is smaller than the $C_{TUN}$ and, therefore, it is difficult to obtain a CR required for acceptable operation of the flash memory. Accordingly, in order to ensure a high CR, methods for increasing the surface area of the floating gate have been suggested.

Kim et al., Korean Patent Publication No. 2003-29203, describes a semiconductor device fabricating method to prevent leakage of current through a multiple tunnel junction layer by reducing the width of the multiple tunnel junction layer.

Shin et al., Korean Patent No. 375231, describes a method for fabricating a non-volatile memory device to maximize an area in which a floating gate and a control gate electrode overlap by forming a U-type floating gate without increasing a cell area so that a low operating voltage and a fast operating characteristic are realized.

Shin et al., U.S. Pat. No. 6,482,728, describes a method for fabricating a floating gate in a non-volatile memory device to reduce a bridge between floating gates and a field loss during processes such as an ONO etching process. In the above-mentioned U.S. Patent, a conductive layer with upper and lower portions is formed over a substrate with field regions formed therein, and the upper portion of the conductive layer is slope-etched, leaving the lower portion of the conductive layer intact. The slope-etched upper portion of the conductive layer is again vertically etched and the lower portion of the conductive layer is concurrently slope-etched.

FIGS. 1a through 1g are cross-sectional views illustrating a conventional flash memory fabricating process to increase the surface area of a floating gate. Referring to FIG. 1a, a tunneling oxide layer 2 is deposited on a silicon substrate 1. A first polysilicon layer 3 to form a first floating gate is deposited on the tunneling oxide 2. Then, a first mask layer 4 is deposited on the first polysilicon layer 3. The first mask layer 4 is generally nitride.

Referring to FIG. 1b, some parts of the first mask layer 4, the first polysilicon layer 3, the tunneling oxide 2, and the silicon substrate 1 are removed by a photolithography process and an etching process to form shallow trench isolation (hereinafter referred to as "STI") within field oxide areas 5 to be formed in a subsequent process.

Referring to FIG. 1c, a field oxide is deposited on the first mask layer 4 and the STI. A chemical mechanical polishing (hereinafter referred to as "CMP") process is then performed so that the field oxide remains only within the STI areas 6.

Referring to FIG. 1d, the STI field oxide is etched until its height reaches the height of the floating gate 3 and the first mask layer 4 is also removed. Then, a second polysilicon layer 7 is deposited over the whole surface of the resulting substrate to form a second floating gate so that the first floating gate 3 is in contact with the second floating gate. A second mask layer is deposited on the second polysilicon layer 7 and selectively etched to form a second mask pattern 8.

Referring to FIG. 1e, a third mask layer is deposited on the second polysilicon layer 7 and the second mask pattern 8. The third mask layer is then anisotropically etched to form spacers 9 on the side-walls of the second mask pattern 8.

Referring to FIG. 1f, the second polysilicon layer 7 is etched using the second mask pattern 8 and the spacers 9 as a hard mask to form the second floating gate 7. The second mask pattern 8 and the spacers 9 are then removed.

Finally, referring to FIG. 1g, a dielectric layer 10 and a third polysilicon layer 11 are sequentially deposited over the whole surface of the resulting structure to form a control gate.

In the above-described prior art process, the length of the floating gate 7 is extended over the field oxide area(s) 6 to increase the surface area of the floating gate 7. In addition, in order to minimize an increase in memory cell size due to the lengthened floating gate 7, the space between adjacent floating gates is minimized by a hard mask process. Thus, as shown in FIG. 1g, the surface area of the floating gate 7 becomes larger because the height and length of the floating gate 7 increase by h and 2 L, respectively, compared to the surface area of the tunneling oxide.

Moreover, the conventional flash memory fabricating method described above necessarily includes several processes such as photolithography, etching, and hard mask layer deposition to increase the length of the floating gate 7 to extend over the field oxide area(s) 6, thereby increasing process costs.

DETAILED DESCRIPTION

Figure 1A:
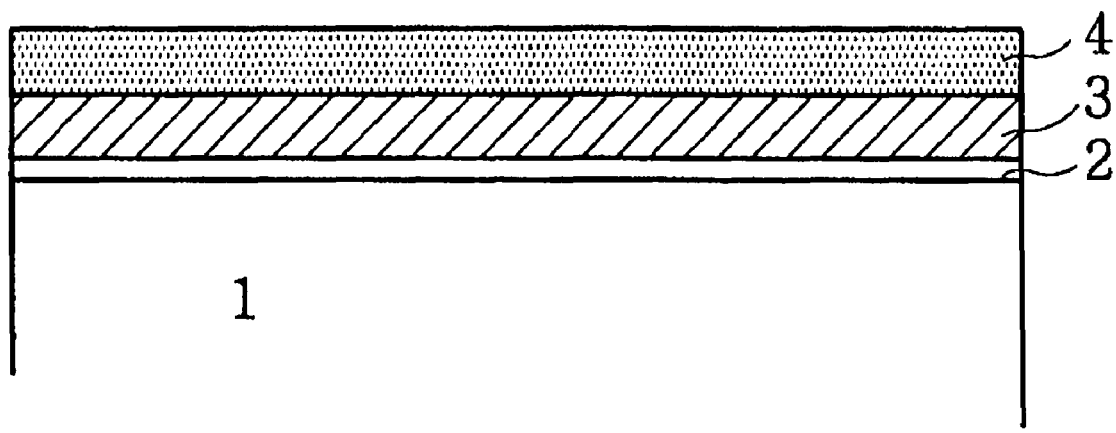
FIGS. 1a through 1g are cross-sectional views illustrating a conventional flash memory fabricating process to increase the surface area of a floating gate.
Figure 1B:
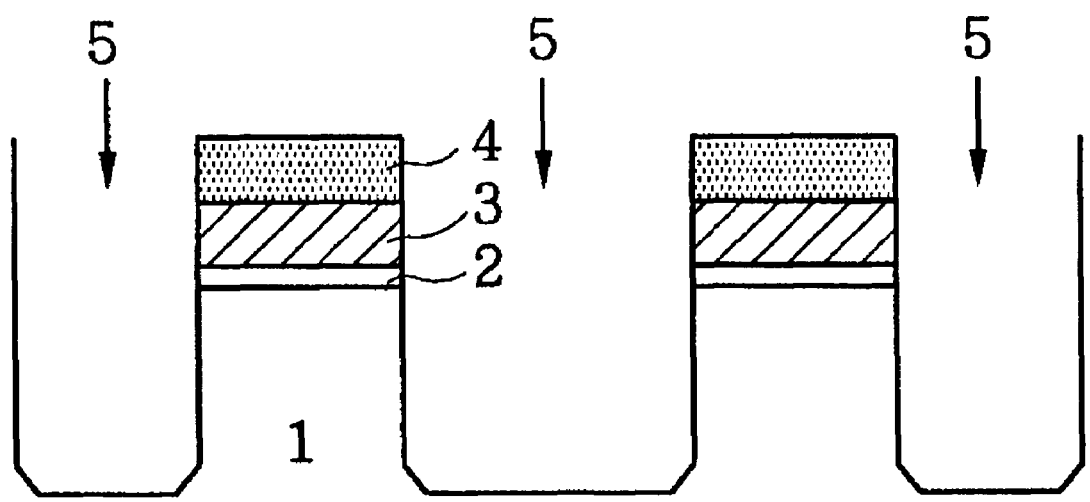
Figure 1C:
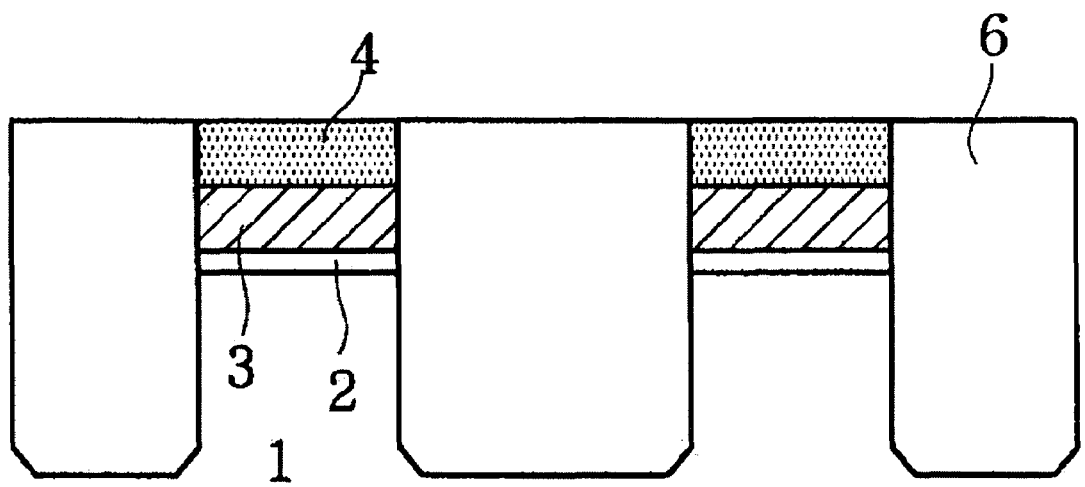
Figure 1D:
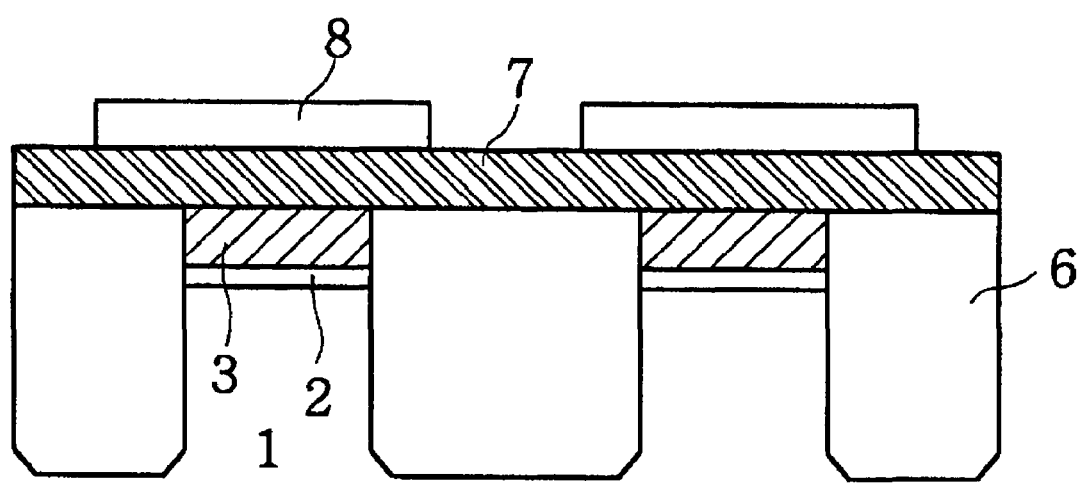
Figure 1E:
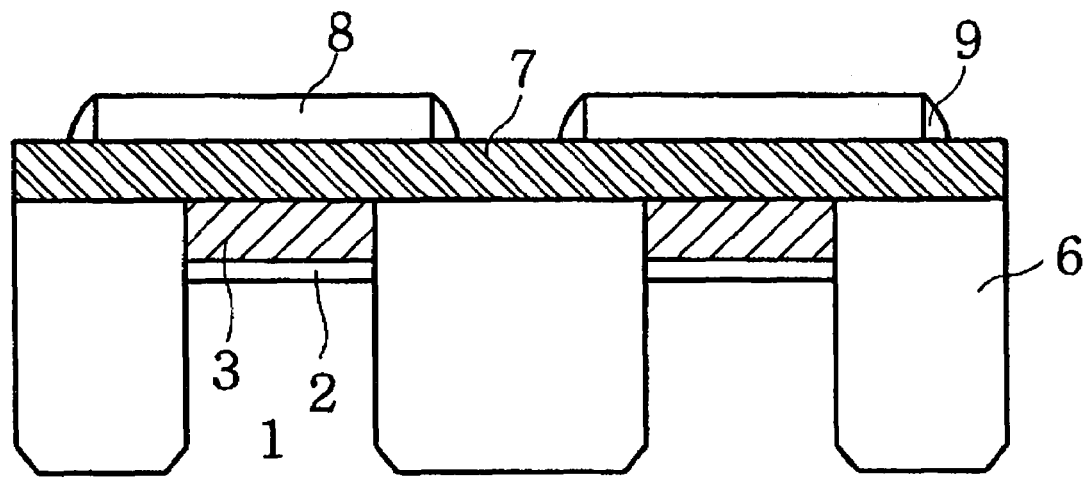
Figure 1F:
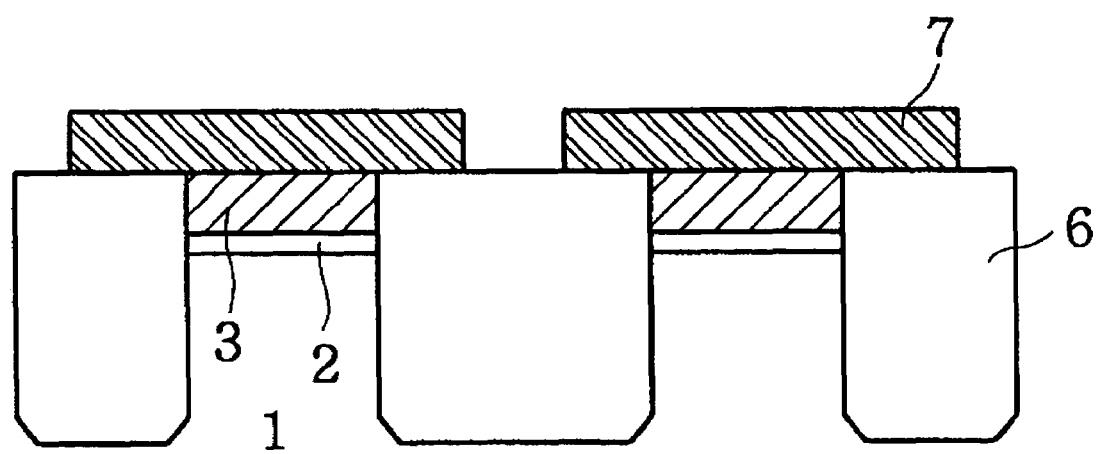
Figure 1G:
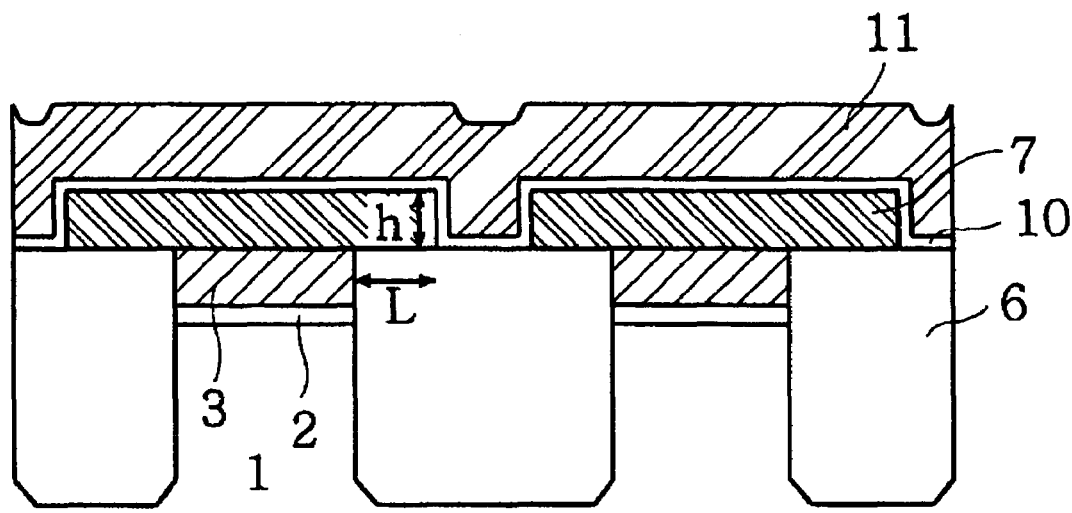
Figure 2A:
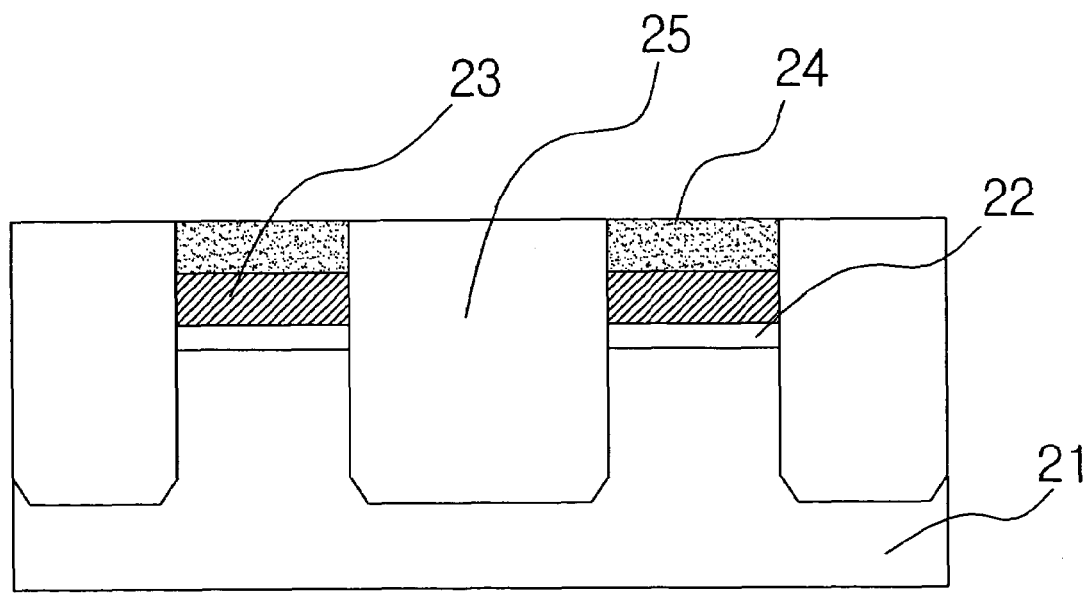
FIGS. 2a through 2g are cross-sectional views illustrating a preferred example flash memory fabricating process performed in accordance with the teachings of the present invention.

Referring to FIG. 2a, a tunneling oxide 22 is deposited on a silicon substrate 21. A first polysilicon layer to form a first floating gate 23 is deposited on the tunneling oxide 22. A first mask layer 24 required for an STI process is then deposited on the first polysilicon layer. (The first mask layer 24 is preferably a nitride layer.) Some parts of the first mask layer 24, the first polysilicon layer, the tunneling oxide 22, and the silicon substrate 21 are removed by means of photolithography and etching processes within field oxide area(s) 25 to be formed in a subsequent process to form STI and the first floating gate 23. Field oxide is then deposited over the whole surface of the resulting structure including the STI. Next, some parts of the field oxide are removed by CMP so that the field oxide remains only within the STI area(s) 25.

Figure 2B:
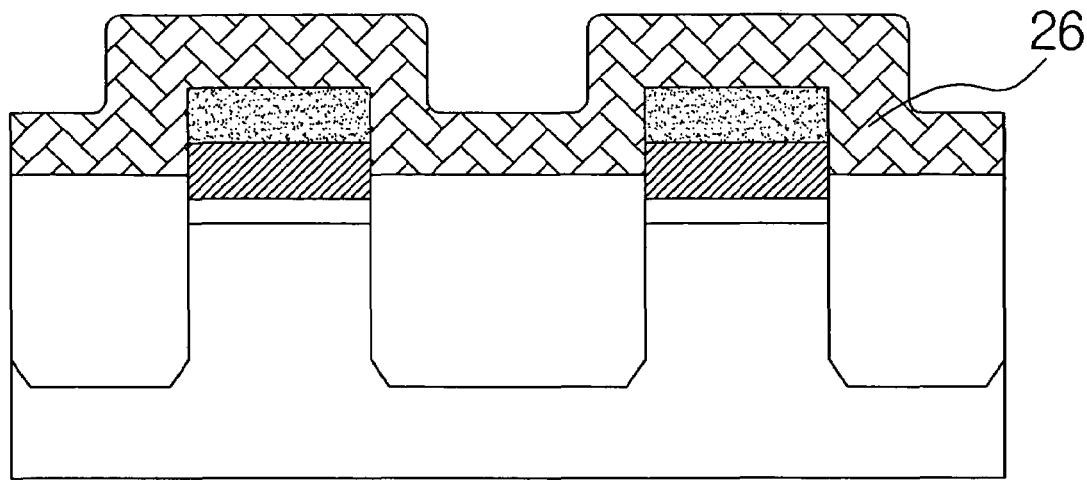

Referring to FIG. 2b, the STI field oxide is further etched until about a half of the sidewall of the first floating gate 23 is exposed. Next, a second polysilicon layer 26 is deposited over the whole surface of the resulting structure to form a second floating gate so that the first floating gate can be connected with the second floating gate.

Figure 2C:
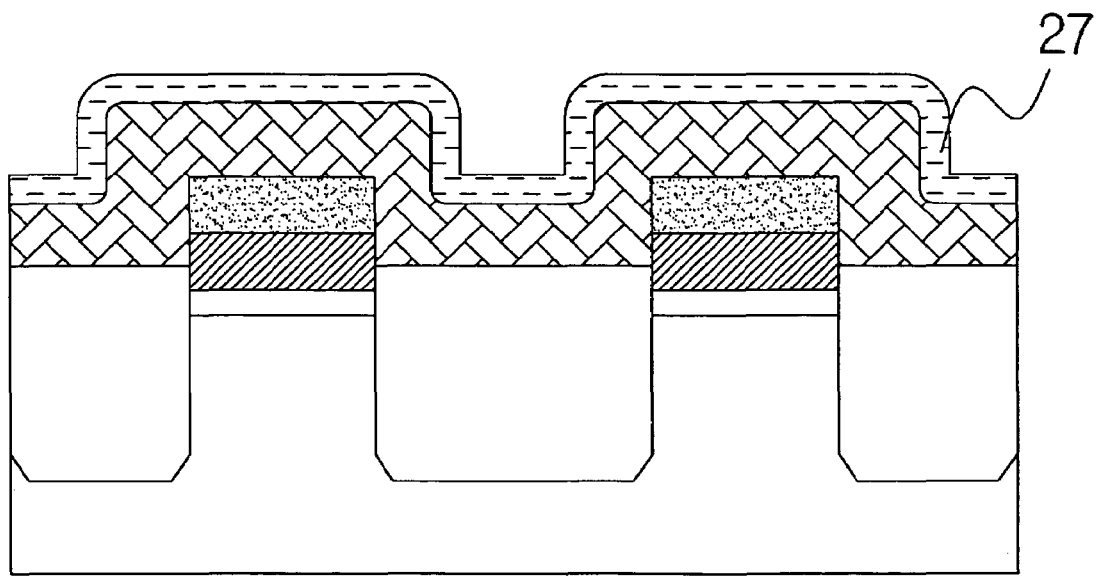

Referring to FIG. 2c, a second mask layer 27 is deposited on the second polysilicon layer 26. The second mask layer is preferably an oxide layer.

Figure 2D:
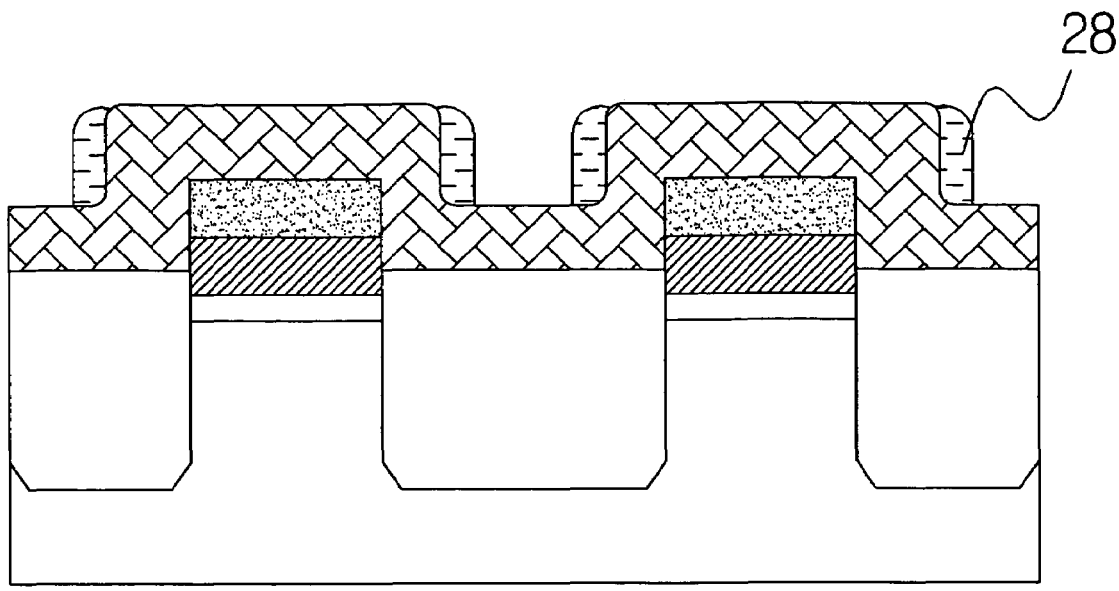

Referring to FIG. 2d, the second mask layer 27 is etched to form spacers 28 on the side-wall portions of the second polysilicon layer 26. More specifically, blanket etching is performed on the second mask layer 27 to form the spacers 28 on the sidewalls of the second polysilicon layer 26.

Figure 2E:
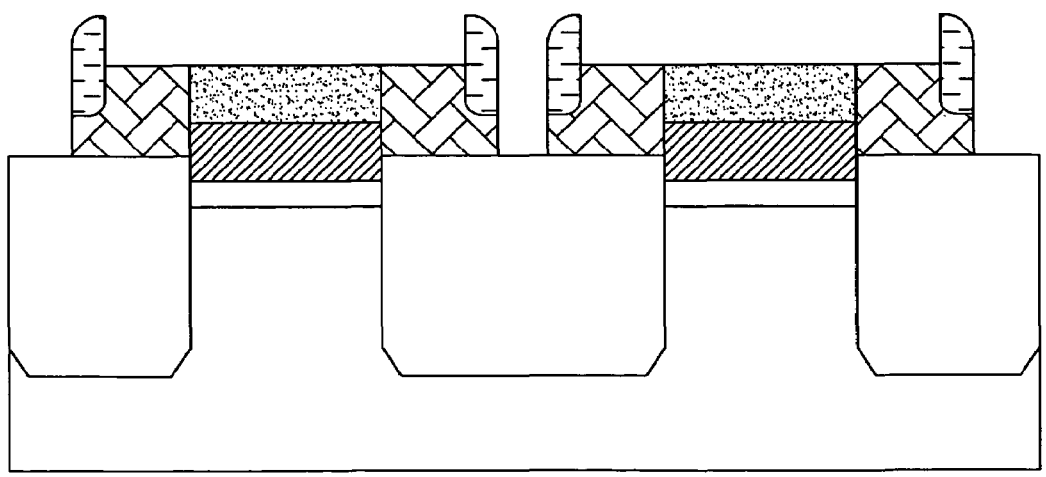

Referring to FIG. 2e, an etching process is performed on the second polysilicon layer 26 using the spacers 28 as a mask to form the second floating gate. The etching process is preferably a reactive ion etch. Through the etching process, the portions of the second polysilicon layer 26 that are both between the spacers 28 and above the first mask layer 24 are completely removed. The remainder of the second polysilicon layer 26 is etched until the first mask layer 24 is exposed.

Figure 2F:
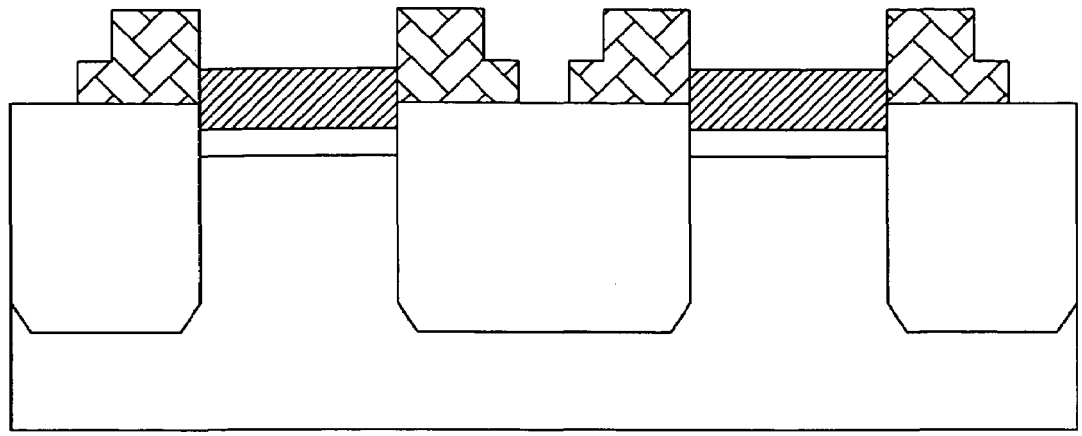

Referring to FIG. 2f, the spacers 28 and the first mask layer 24 are removed to complete a floating gate consisting of the first and second floating gates. As shown in FIG. 2f, the first floating gate is connected with the second floating gate, and the second floating gate protrudes upward higher than the first floating gate.

Figure 2G:
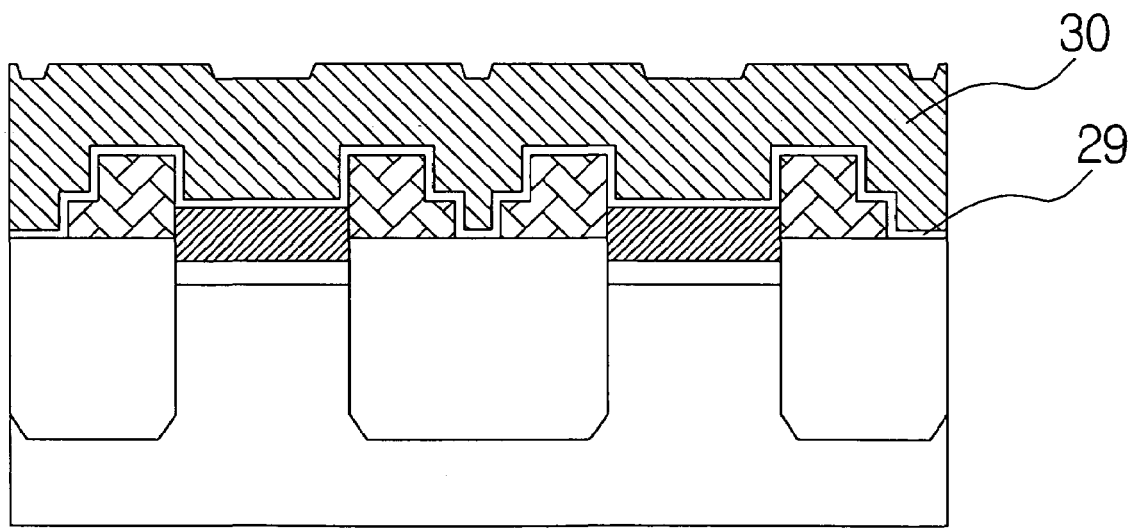

Referring to FIG. 2g, a dielectric layer 29 is deposited over the entire surface of the structure of FIG. 2f. A third polysilicon layer 30 is deposited on the dielectric layer 29 to form a control gate.

The illustrated floating gate has a part that is protruded upward. As a result, the floating gate achieves a high coupling ratio CR because the capacitance of the dielectric layer 29 (i.e., $C_{ONO}$) increases due to the protrusion of the floating gate.

Figure 3:
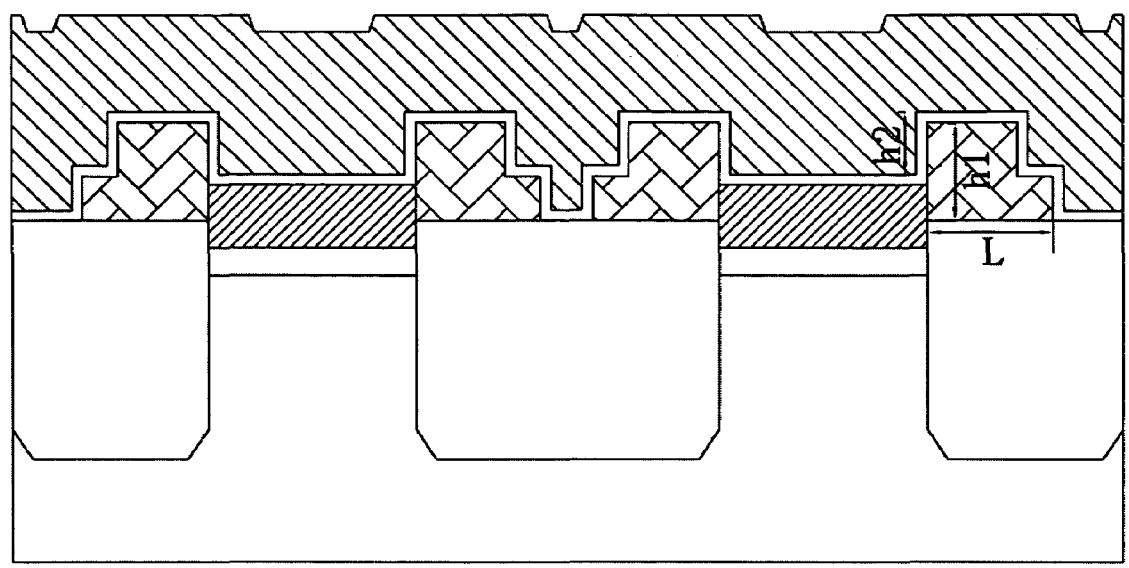
FIG. 3 is a cross-sectional view illustrating an example flash memory device constructed in accordance with the teachings of the present invention.

In the above-described example methods for fabricating flash memory, the length (L) of the second floating gate on the field oxide 25 may be decreased as the height of the sidewalls (h1, h2) are increased (see FIG. 3). Therefore, the length (L) of the floating gate may be reduced without changing the surface area of the floating gate and, therefore, the size of a memory cell including the reduced length floating gate may ultimately be reduced. In other words, the fabrication methods disclosed herein can reduce the size of a flash memory cell and the voltage required for programming and erase operations with respect to such a cell by increasing the surface area of the capacitor formed between the floating gate and the control gate 30. In addition, the disclosed methods can be used to achieve low cost and high yield semiconductor device production by simplifying the mask processes.

In view of the foregoing persons of ordinary skill in the art will appreciate that improved flash memory devices and improved methods of fabricating a flash memory have been disclosed. An illustrated example method of fabricating a flash memory reduces the size of a memory cell by increasing the surface area of the capacitor formed between a floating gate and a control gate. This reduction also reduces the voltage required for programming and erase operations. The illustrated example method also permits low cost and higher yield semiconductor device production by simplifying mask processes.

A disclosed example method of fabricating a flash memory comprises: sequentially depositing a tunneling oxide, a first polysilicon layer to form a first floating gate, and a first mask layer over a silicon substrate, etching the silicon substrate, the tunneling oxide, the first polysilicon layer, and the first mask layer using a predetermined pattern to form STI and the first floating gate, depositing a field oxide over the substrate including the STI, removing part of the field oxide, depositing a second polysilicon layer to form a second floating gate over the first mask layer and the field oxide, depositing a second mask layer over the second polysilicon layer, etching the second mask layer to form spacers, removing part of the second polysilicon layer using the spacers as a mask to form the second floating gate, removing the spacers and the first mask layer, and depositing a dielectric layer and a third polysilicon layer to form a control gate over the first floating gate and the second floating gate.

It is noted that this patent claims priority from Korean Patent Application Serial Number 10-2003-0066153, which was filed on Sep. 24, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of fabricating a flash memory comprising:
   forming a first floating gate;
   extending the first floating gate by forming a step-shaped second floating gate adjacent a first sidewall of the first floating gate, the step-shaped second floating gate including a first part extending upward above the first floating gate and a second part extending sideward from the first part, wherein forming the step-shaped second floating gate adjacent the first sidewall of the first floating gate comprises:
   depositing a polysilicon layer over the first floating gate;
   forming spacers on side-wall portions of the polysilicon layer, wherein the spacers are in contact with the side-wall portions and an upper surface of the polysilicon layer below the spacers; and etching the polysilicon layer using the spacers as a mask to form the step-shaped second floating gate;

depositing a dielectric layer on the first floating gate and the step-shaped second floating gate, wherein the dielectric layer is in contact with both the first floating gate and the step-shaped second floating gate; and forming a control gate on the dielectric layer.

2. A method as defined in claim 1 wherein the step-shaped second floating gate does not extend over the first floating gate.

3. A method as defined in claim 1 wherein the step-shaped second floating gate is located above a first STI area adjacent the first floating gate.

4. A method as defined in claim 3, wherein the second part of the step-shaped second floating gate is in contact with the first STI area.

* * * * *